(12) United States Patent
Gieskes

(10) Patent No.: US 7,032,304 B2
(45) Date of Patent: Apr. 25, 2006

(54) METHOD FOR CONVEYING PRINTED CIRCUIT BOARDS

(75) Inventor: Koenraad A. Gieskes, Binghamton, NY (US)

(73) Assignee: Delaware Capital Formation, Wilmington, DE (US)

( * ) Notice: Subject to any disclaimer, the term of this patent is extended or adjusted under 35 U.S.C. 154(b) by 0 days.

(21) Appl. No.: 10/683,001

(22) Filed: Oct. 14, 2003

(65) Prior Publication Data
US 2004/0060170 A1    Apr. 1, 2004

Related U.S. Application Data

(63) Continuation of application No. 09/487,324, filed on Jan. 19, 2000, now Pat. No. 6,643,917.

(51) Int. Cl.
*H05K 3/30* (2006.01)
(52) U.S. Cl. .................. 29/832; 29/833; 29/834; 29/740; 29/33 P; 29/429; 198/465.1
(58) Field of Classification Search ............ 29/740, 29/742, 744, 830, 832, 33 K, 33 P; 198/345.1, 198/346.2, 349, 358; 414/224.01; 700/115, 700/228
See application file for complete search history.

(56) References Cited

U.S. PATENT DOCUMENTS

| 3,543,392 A | 12/1970 | Perry et al. |
|---|---|---|
| 4,309,600 A | 1/1982 | Perry et al. |
| 4,492,297 A | 1/1985 | Sticht |
| 4,697,318 A | 10/1987 | Wicham et al. |
| 4,708,232 A | 11/1987 | Hata et al. |
| 4,725,182 A * | 2/1988 | Sakamoto et al. ...... 414/331.02 |
| 5,495,661 A | 3/1996 | Gromer et al. |
| 5,517,748 A | 5/1996 | Park |
| 6,460,692 B1 | 10/2002 | Dionne et al. |
| 6,643,917 B1 * | 11/2003 | Gieskes .................. 29/740 |
| 6,836,960 B1 * | 1/2005 | Hamasaki et al. ............ 29/832 |
| 6,892,446 B1 | 5/2005 | Hwang et al. |
| 2004/0128828 A1 | 7/2004 | Hwung et al. |
| 2004/0211059 A1 | 10/2004 | Kim et al. |

FOREIGN PATENT DOCUMENTS

| JP | 4-354660 | 12/1992 |
|---|---|---|
| JP | 5-57578 | 3/1993 |

* cited by examiner

*Primary Examiner*—Minh Trinh
(74) *Attorney, Agent, or Firm*—Schmeiser, Olsen & Watts

(57) ABSTRACT

A method for conveying printed circuit boards (PCBs) in a system that includes at least two assembly modules, where each assembly module has multiple conveyors for delivering the PCBs so that while processing some PCBs, other PCBs can bypass particular assembly modules.

12 Claims, 9 Drawing Sheets

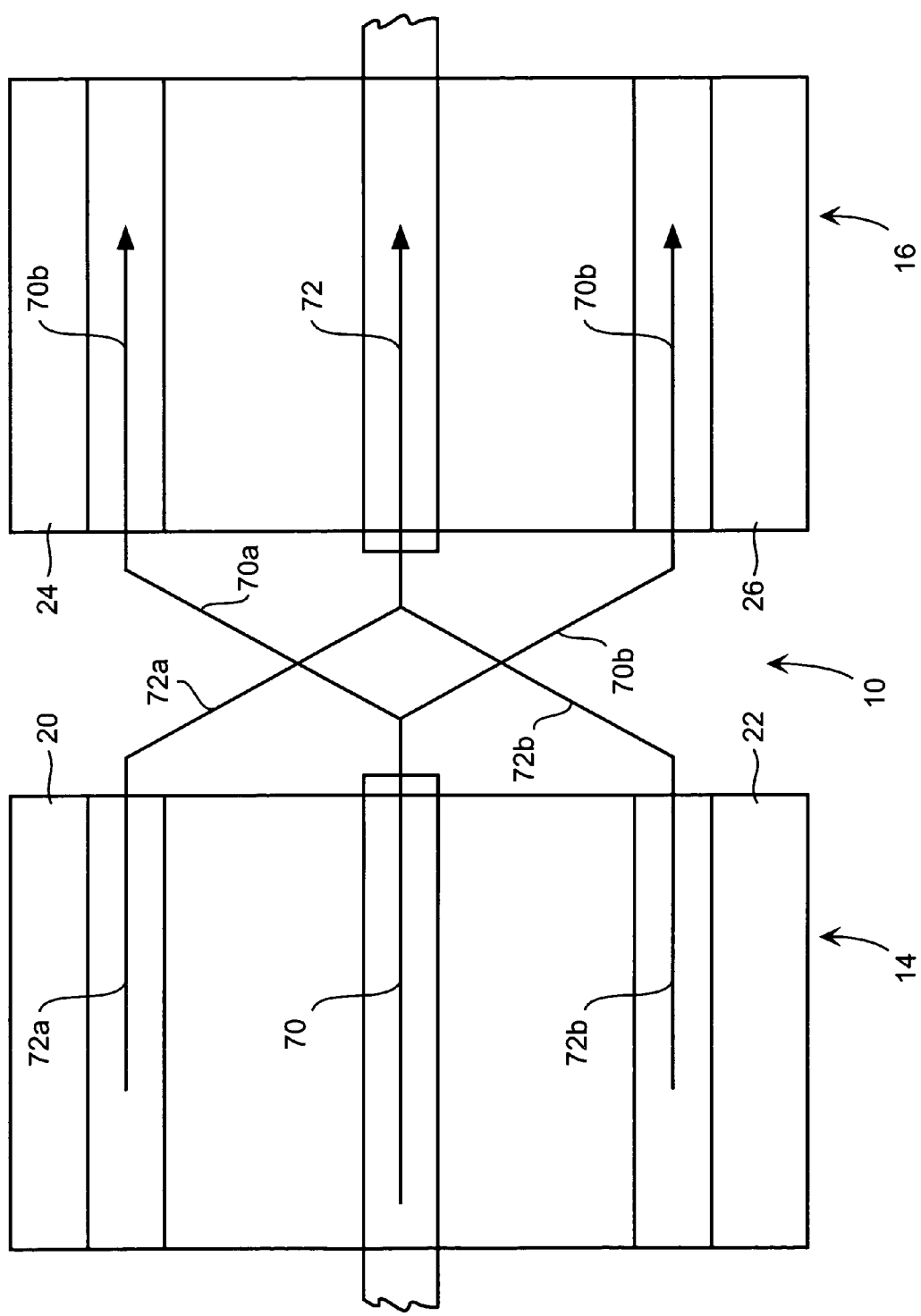

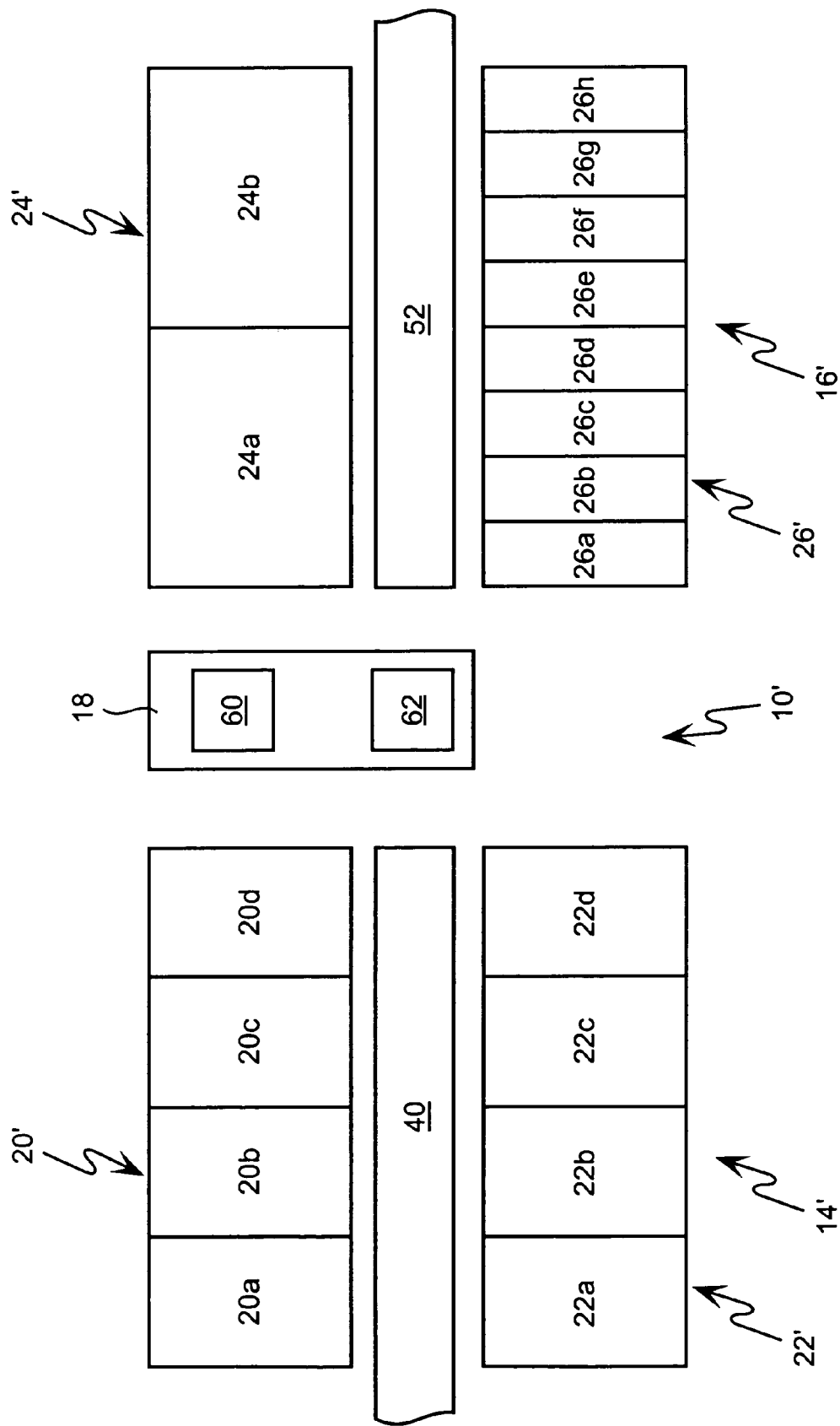

METHOD FOR CONVEYING PRINTED CIRCUIT BOARDS

CROSS-REFERENCE TO RELATED APPLICATIONS

This application claims the benefit of U.S. patent application Ser. No. 09/487,324 filed on Jan. 19, 2000 now U.S. Pat. No. 6,643,917 issued Nov. 11, 2003, the entire content of which is incorporated by reference.

FIELD OF THE INVENTION

This invention relates to a system for automated assembly of electronic components to substrates, such as printed circuit boards, and more particularly relates to systems having multiple assembly stations.

BACKGROUND OF THE INVENTION

Systems have been in use in the past for programmable, automated assembly of electronic components to substrates. Commonly, automated programmable machines for effecting such assembly are referred to as "Pick and Place" machines. Such substrates include, but are not limited to, rigid substrates such as printed circuit boards (PCBs) or the like. Unless indicated otherwise, the term "PCB" will be used hereinafter to refer not only to conventional printed circuit boards, but also inclusive of all other substrates that may be used with Pick and Place machines, including for example, flex cables. Such electronic components to be assembled to the substrates may include microprocessors, integrated circuits, transistors, resistors, connectors or the like.

Frequently, it is necessary to operatively connect multiple Pick and Place machines in series that form a "line" to achieve desired levels of productivity and throughput, or accommodate highly complex PCBs or PCBs with larger numbers of components to be placed. In such a case, certain of the Pick and Place machines in a line will be dedicated to placing certain of the components on the PCB. If one of the Pick and Place machines in the line is inoperative for any reason, it generally is possible for PCBs to be passed through the inoperative machine to other operative machines in the line.

For instance, the HS50 and S23 brand Pick and Place machines from Siemens GmbH of Munich, Germany includes a vertical elevator at each end of a Pick and Place machine with a conveyor extending beneath the machine from the front vertical elevator to the back vertical elevator. In this manner, a particular PCB could bypass the machine by just being conveyed therethrough; such as if the PCB is defective or the machine is inoperative. Alternatively, PCBs could bypass the particular machine by using the vertical elevators and the conveyor underneath the machine if the machine itself is inoperative. However, this approach is relatively slow and cumbersome and not adapted to frequent use in high volume production lines. Moreover, even with such a bypass mechanism, it may be difficult to complete the assembly of all of the components to a particular PCB in one pass. The overall productivity of the serial Pick and Place machines is thus reduced or limited.

In an effort to enhance the productivity of Pick and Place machines, and to conserve on floor space, Pick and Place machines have been produced that include two parallel internal conveyors and two independent Pick and Place mechanism for simultaneously processing two PCBs in parallel on each of the conveyors within a particular machine. Generally, the output from each independent Pick and Place mechanism within a machine is then transported by a separate conveyor to the next machine in the line. However, even with this arrangement, if one of the Pick and Place machines in a line is inoperative, the effectiveness of the entire line is severely impacted.

Therefore, conventional systems for assembling electronic components to printed circuit boards, while having their own utility, may not be entirely satisfactory in terms of redundancy and flexibility, if one or more of the electronic assembly module are inoperative.

SUMMARY

The system of the present invention provides a two part of assembly modules for assembling electronic components to a series of printed circuit boards or like PCBs. The pairs of assembly modules are operatively connected in series, and each module includes a pair of assembly stations operating in parallel within the module. Means are provided to bypass the first assembly module and deliver unpopulated PCBs to the second module for processing, while simultaneously bypassing the second assembly module with PCBs populated by the first assembly module. In the event that one of the assembly stations of either assembly module is inoperative, it may be bypassed and the assembly of its electronic components redistributed to the remaining, operative assembly stations to optimize the productivity of the system.

More specifically, the present invention provides a system for populating electronic components onto a plurality of printed circuit boards. The system includes a first assembly module having parallel assembly stations for placing electronic components on an unpopulated printed circuit board and a first bypass conveyer extending through the first assembly module intermediate the parallel assembly stations for conveying unpopulated printed circuit boards therethrough. The system further includes a second assembly module having parallel assembly stations for placing electronic components on an unpopulated printed circuit board and a second bypass conveyor extending through the second assembly module intermediate the parallel assembly stations for conveying populated printed circuit boards therethrough.

The system also includes a shuttle for simultaneously conveying a pair of printed circuit boards between the first and the second assembly modules. The shuttle is shiftable between a first position for either receipt of a populated printed circuit board from one of the assembly stations of the first assembly module and an unpopulated printed circuit board the first bypass conveyor, or transfer of an unpopulated printed circuit board from the first bypass conveyor to one of the assembly stations of the second assembly module, and a second position for either receipt of a populated printed circuit board from the other of the assembly stations of the first assembly module and an unpopulated printed circuit board the first bypass conveyor, or transfer of an unpopulated printed circuit board to the other of the assembly stations of the second assembly module and a populated printed circuit board to the second bypass conveyor;

Wherein the shuttle may be sequentially shifted to the first position to accept a populated printed circuit board from one of the assembly stations of the first assembly module and an unpopulated printed circuit board from the first bypass conveyor, to the second position to transfer the populated printed circuit board to the second bypass conveyor and to transfer the unpopulated printed circuit board to one of the assembly stations of the second assembly module, and to accept a populated printed circuit board from the other of the assembly stations of the first assembly module and an unpopulated printed circuit board from the first bypass conveyor, and to the first position to transfer an unpopulated printed circuit board to the other of the assembly stations of the second assembly module and a populated printed circuit board to the second bypass conveyor.

In one preferred embodiment of the present invention, the system further includes control means for bypassing each of the first and the second assembly stations of the first and second assembly modules by shifting unpopulated printed circuit boards to the respective first or second bypass conveyor.

In another embodiment of the invention, a method for assembling electronic components to a substrate includes providing a plurality of unpopulated substrates to be populated; providing a first module and a second module for populating the plurality of unpopulated substrates, with the first module and the second module operatively positioned in series with respect to each other; sequentially populating a first portion of the plurality of substrates in two parallel paths within the first module; bypassing the second module with the substrates populated by the first module; bypassing the first module with a second portion of the plurality of unpopulated substrates; sequentially populating a second portion of said plurality of substrates in two parallel paths within the second module.

The method may further include the step of bypassing a path within either of the first module or the second module when a path has become inoperative for populating a substrate.

These and other objects, features and advantages of the present invention will be apparent an fully understood from the following detailed description of the preferred embodiments, taken in connection with the appended drawings in which like numerals describe like parts in the several views.

BRIEF DESCRIPTION OF THE DRAWINGS

FIG. 2 is a schematic representation of the assembly system of the present invention showing the path of populated and unpopulated printed circuit boards through the system;

FIG. 3 is a schematic representation of an alternative embodiment of the assembly system of the present invention.

DETAILED DESCRIPTION OF THE INVENTION

Figure 1A:
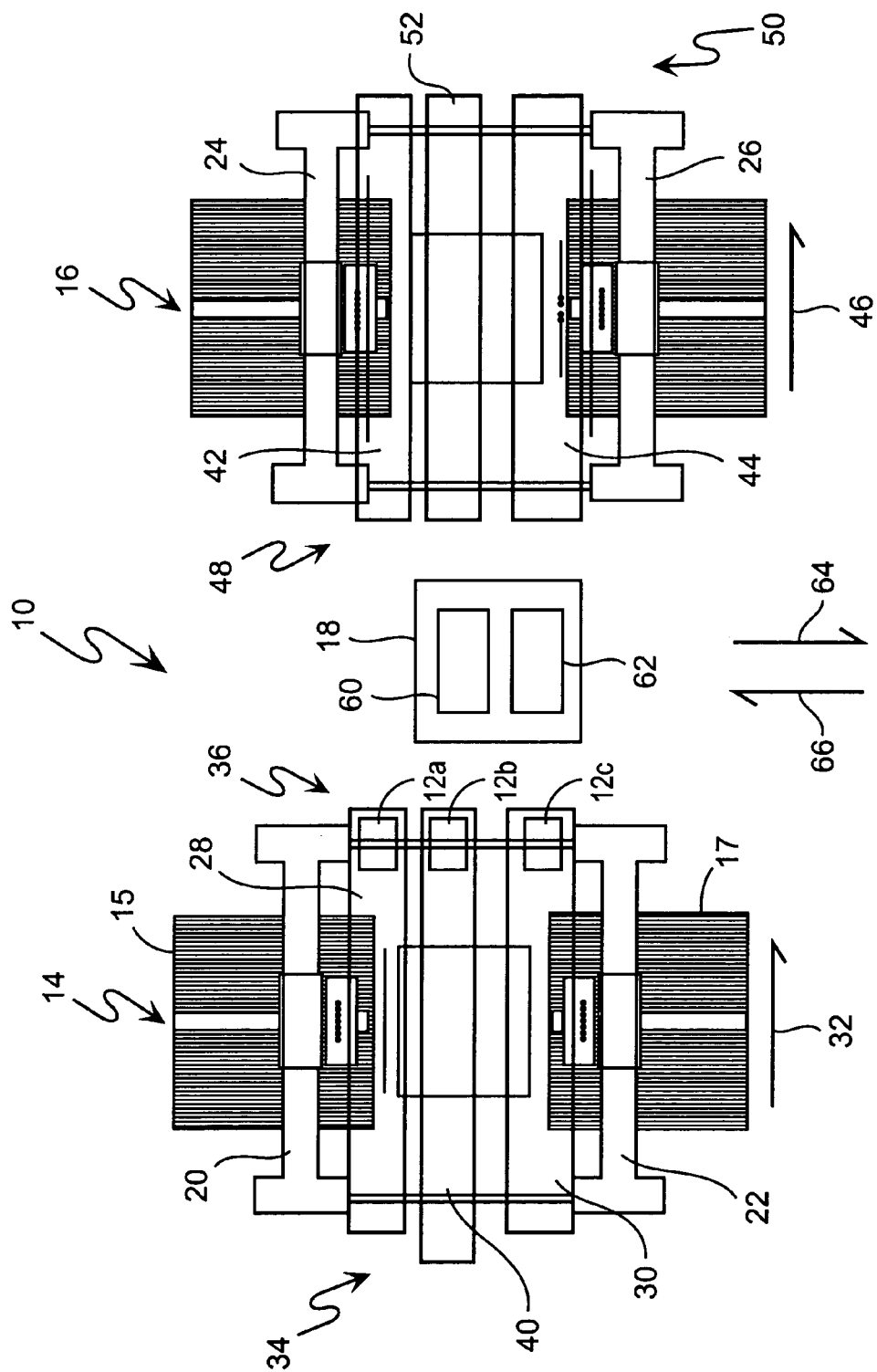
FIG. 1a is a schematic representation of an assembly system according to the present invention in a first state.

The redundant assembly system of the present invention provides a pair of assembly modules for assembling electronic components to a series of printed circuit boards or like PCBs. The pairs of assembly modules are operatively connected in series, and each assembly module includes a pair of assembly stations operating in parallel within the module. Means are provided to bypass the first assembly module and deliver unpopulated PCBs to the second module for processing, while simultaneously bypassing the second assembly module with PCBs populated by the first assembly module. In the event that one of the assembly stations of either assembly module is inoperative, it may be bypassed and the assembly of its electronic components redistributed to the remaining, operative assembly stations to optimize the productivity of the system by redundant use of the operative assembly stations.

Referring now sequentially to FIGS. 1a–1f, there is shown automated electronic assembly system 10 according to the present invention in various stages of processing printed circuit boards (PCBs) 12. System 10 includes a first assembly module 14 and a second assembly module 16, and means for conveying PCBs between the first and second assembly modules. In the illustrated embodiment of the invention, the means for conveying includes shuttle 18 interposed between the first and second assembly modules. First assembly module 14 includes a first assembly station 20 and a second assembly station 22. First and second assembly stations 20 and 22 operate in parallel to simultaneously place various electronic components (not shown) precisely onto desired locations on PCBs 12. Likewise, second assembly module 16 includes first assembly station 24 and second assembly station 26. First and second assembly stations 24 and 26 operate in parallel to simultaneously place various electronic components (not shown) precisely onto desired locations on printed circuit boards (PCBs) 12.

By electronic components, it is meant any component that may be mounted and/or electrically connected to a PCB, and includes, but is not limited to, surface mount components, through hole components (such as axial and radial lead devices), flip chip devices, Chip Scale Packages (CSPs), Ball Grid Array (BGA) devices or the like, as well as various components generally referred to as Odd Form devices such as connectors and heat sinks.

Typically, such assembly stations are Pick and Place machines 15, 17 that include a pick up head that uses mechanical grippers, or more commonly vacuum nozzles, to sequentially acquire an electronic component. The electronic components are then are precisely moved to a desired location over a PCB and then placed onto the PCB. Typically, the electronic component is temporarily secured in position on the PCB such as by a quantity of adhesive pre-placed on the desired location on the PCB. Until a later station in the line, where it is permanently soldered or otherwise secured in place to the PCB. Sequential PCBs are moved through the Pick and Place machine by a conveyor or equivalent mechanism.

Some Pick and Place machines have a single pick up head with one or more pick up nozzles that each acquires an electronic component. The nozzles then move as a unit over the PCB to precisely place the electronic components in desired locations. Such pick up heads with multiple nozzles are available from Universal Instruments Corporation of Binghamton, New York under the trademark "FlexJet".

If higher through put is desired, Pick and Place Machines are available with two pick up heads are provided, each for independent movement in X and Y directions with respect to the PCB for simultaneously placing multiple components to the PCB (Single Beam, Dual Head) as opposed to those with a single pick up head and conveyor (Single Beam, Single Head). Pick and Place machines may also be constructed that have two parallel conveying systems, each used independently in conjunction with separate independent pick up heads, so that two PCBs may be processed simultaneously and independently within the same Pick and Place machine (Dual Beam, Dual Head).

However, it will be understood that two separate Pick and Place machines, each with a single conveyor and pick up head (Single Beam, Single Head), may be operated in tandem with each functioning in parallel as an assembly station and together forming an assembly module as hereinafter described in regard to the system of the present invention. Further, each of the first and second assembly stations as described hereinafter may include a plurality of Single Beam, Single Head Pick and Place machines may be connected serially to collectively form an assembly station. All of such Pick and Place machines are available from Universal Instruments Corporation of Binghamton, N.Y. under the trademark "GSM".

In the preferred embodiment of the invention, the first assembly module 14 comprises a single Dual Beam, Dual Head Pick and Place machine that includes two parallel internal conveyors 28 and 30 and two independent Pick and Place heads (not shown) each operating with one of the internal conveyors to simultaneously populate separate PCBs conveyed therethrough in direction 32 from front end 34 to back end 36. Thus, although utilizing a single Pick and Place machine, each Pick and Place head and conveyor therein comprises an assembly station that operates independently of, but parallel with the other conveyor and Pick and Place head.

First assembly module 14 also includes first bypass conveyor 40 intermediate conveyers 28 and 30. First bypass conveyor conveys unpopulated PCBs from front end 34 to back end 36 of the first assembly module, without engagement with either of the first or second assembly stations 20 and 22, as will be explained in greater detail hereinafter. For the purposes of this invention, the term "unpopulated PCB" refers to PCBs, while possibly containing electronic components previously assembled thereto by other means, are provided prior to assembly of the particular electronic components to be assembled thereon by the system of the present invention.

Also in the preferred embodiment of the invention, the second assembly module 16 comprises a single Dual Beam, Dual Head Pick and Place machine that includes two parallel internal conveyors 42 and 44 and two independent Pick and Place heads (not shown) each operating with one of the internal conveyors to simultaneously populate separate PCBs conveyed therethrough in direction 46 from front end 48 to back end 50.

Second assembly module 16 also includes second bypass conveyor 52 intermediate conveyers 42 and 44. Second bypass conveyor conveys populated PCBs from front end 48 to back end 50 of the second assembly module 16, without engagement with either of the first or second assembly stations 24 and 26, as will be explained in greater detail hereinafter. For the purposes of this invention, the term "populated" shall mean a PCB having one or more electronic component assembled thereon by either of the first or second assembly stations of the first assembly module, but may provide for additional electronic components to be subsequently assembled thereon by other means or other systems.

Shuttle 18 includes a conveying apparatus for simultaneously receiving two PCBs from the first assembly module 14 or for subsequently offloading the PCBs to the second assembly module 16. Shuttle 18 includes first and second transfer portions 60 and 62. In the preferred embodiment of the system of the present invention, the first and second transfer portions are spaced from each other by a distance "d". Likewise, first and second conveyors 28 and 30 of the first assembly module 14, and first bypass conveyor 40 are preferably also equidistantly spaced from each other by the same distance "d", with the first bypass conveyor in a medial position. Finally, first and second conveyors 42 and 44 of the second assembly module 16, and second bypass conveyor 52 are also preferably equidistantly spaced from each other by the same distance "d" transverse to direction 46, with the second bypass conveyor in a medial position.

Shuttle 18 may be shifted between first and second positions relative to the first and second assembly modules. The first position of the shuttle is shown in FIG. 1a, wherein the first transfer portion 60 is aligned with the first conveyor 28 at the back end 36 of the first assembly module, for receipt of populated PCBs therefrom. When the shuttle 18 is in the first position, the first transfer portion 60 is also aligned with first conveyor 42 of the second assembly module, for offloading unpopulated PCBs thereto.

Simultaneously, second transfer portion 62 is aligned with first bypass conveyor 40, also at the back end 36 of the first assembly module 14, for receiving unpopulated PCBs therefrom. When the shuttle 18 is in the first position, the first transfer portion 60 is also aligned with the front end 36 of the first conveyor 42 of the second assembly module 16, for offloading unpopulated PCBs thereto.

Figure 1B:
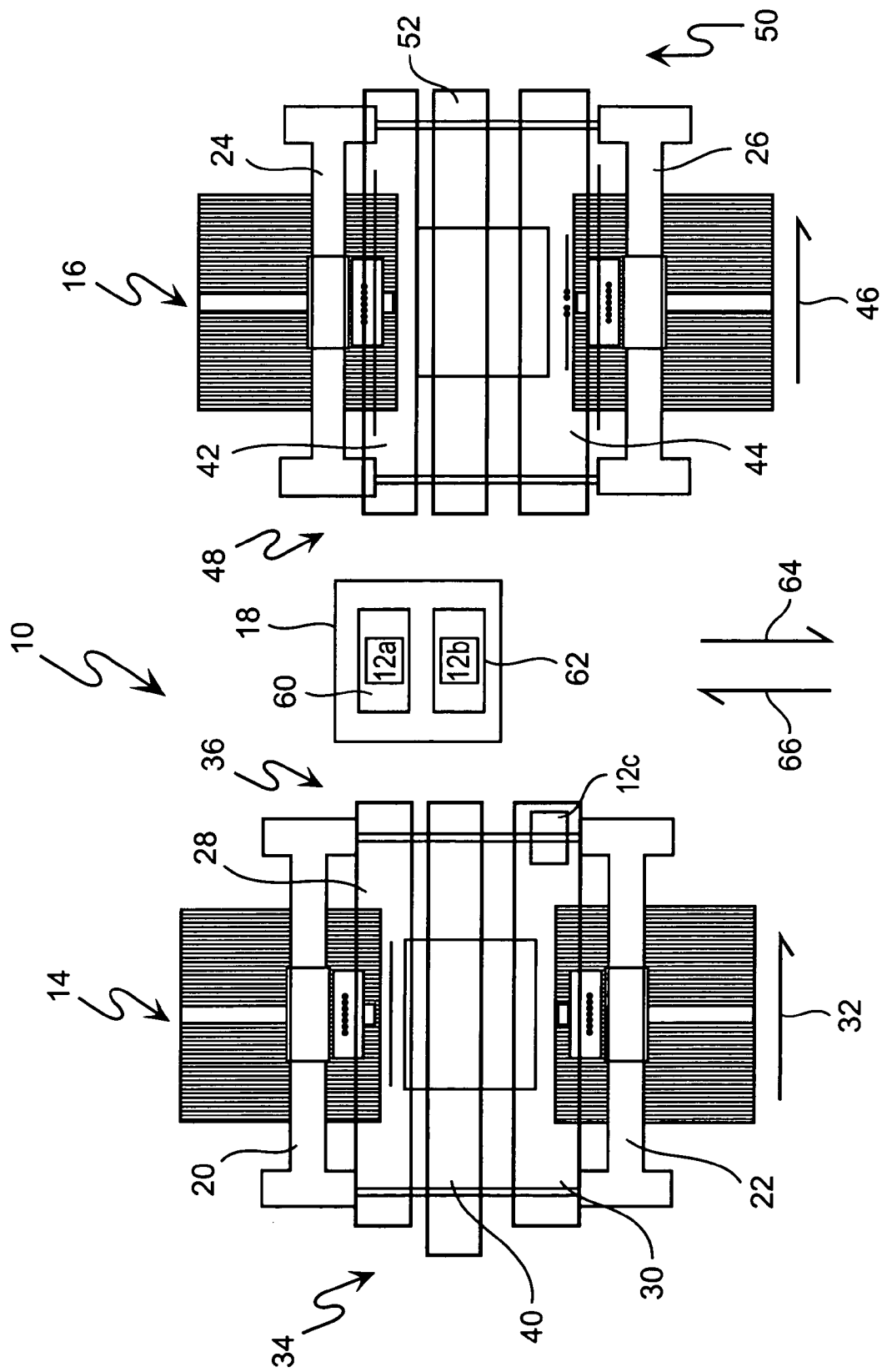
FIG. 1b is a schematic representation of the assembly system of FIG. 1a in a second state.
Figure 1C:
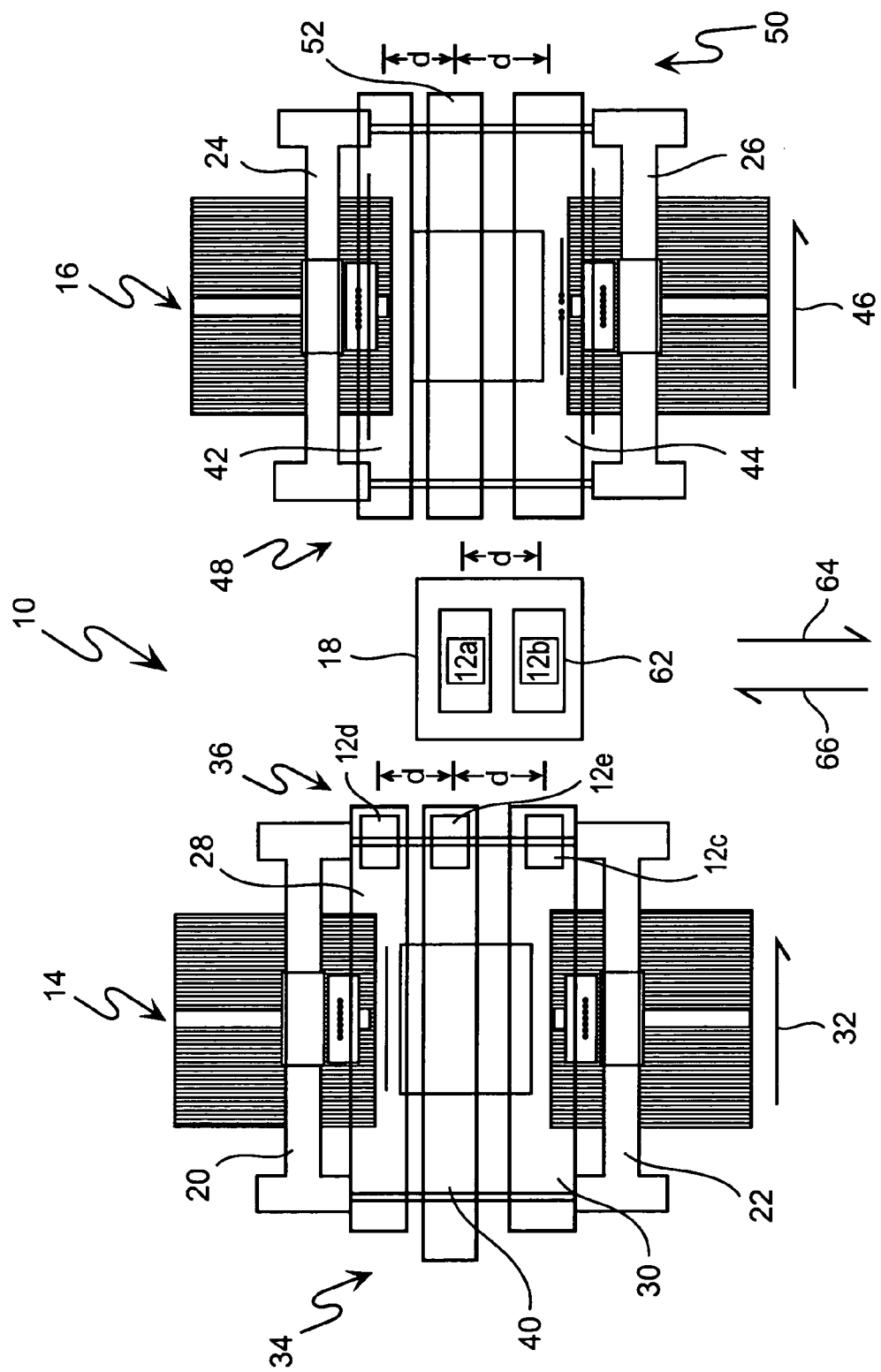
FIG. 1c is a schematic representation of the assembly system of FIG. 1a in a third state.

The second position of shuttle 18 is shown in FIG. 1c, wherein the first transfer portion 60 is aligned with the second bypass conveyor 52 at the front end 48 of the second assembly module 16, for offloading of populated PCBs thereto. When the shuttle 18 is in the second position, the first transfer portion 60 is also aligned with first bypass conveyor 40 at the back end 36 of the second assembly module, for receipt of unpopulated PCBs therefrom.

Simultaneously, second transfer portion 62 is aligned with second conveyor 30; also at the back end of the first assembly module 14, for receiving populated PCBs therefrom. When the shuttle 18 is in the second position, the second transfer portion 62 is also aligned with second conveyor 44 of the second assembly module 16 at the front end 48 thereof, for offloading unpopulated PCBs thereto.

Most preferably, the first and second assembly modules 14 and 16 are situated and aligned such that the shuttle 18 may be reciprocated a distance "d" between its first and second positions transverse to the directions 32 and 46, as is shown sequentially in FIGS. 1a–1g and as will be now described in greater detail. However, it is to be recognized that it is within the spirit and scope of the present invention that the first and second assembly modules and the shuttle 18 may be positioned and have motions that are different than that described hereinafter, as long as the relative movement of PCBs through the system is maintained.

It will also be understood that an embodiment of the shuttle 18 may be constructed (not shown) with a single transfer portion for accepting and offloading PCBs. This provides a simpler and less expensive design, and would operate in all other respect as herein described. However, a single transfer portion design would require additional movement to transfer the PCBs at a reduced rate compared to the embodiment shown and described hereinelsewhere.

In operation, and referring again sequentially to FIGS. 1a through 1h, the system 10 of the present invention receives a plurality of unpopulated PCBs 12 (designated 12a and 12c) of each of the first and second conveyors 28 and 30, respectively, of the first and second assembly stations 20 and 22 at the front end 34 of first assembly module 14. An unpopulated PCB (designated 12b) also is loaded onto first bypass conveyer 40 at the front end 34 of first assembly module 14. PCBs 12a and 12c are populated, at least partially, by passing through first and second assembly stations 20 and 22 in direction 32 and arrive at the back ends 36 of firs assembly module 14 for further processing. The unpopulated PCB 12b also travels in direction 32 to the back end 36, conveyed by the bypass conveyor 40.

Shuttle 18 accepts PCBs 12a and 12b to conveyor stations 60 and 62, respectively, while the shuttle is in its first position, as shown in FIG. 1b. PCB 12c resides at the end of second conveyor 30. Shuttle 18 then shifts in direction 64 transverse to direction 32 to the shuttle's second position, as in FIG. 1c. Concurrently, PCBs 12d (at least partially populated by first assembly station 20) and 12e (unpopulated and transported by first bypass conveyor 40) each move in direction 32 and arrive at the back end 36 of the first assembly module 14 on first conveyor 28 and first bypass conveyor 40, respectively.

Figure 1D:
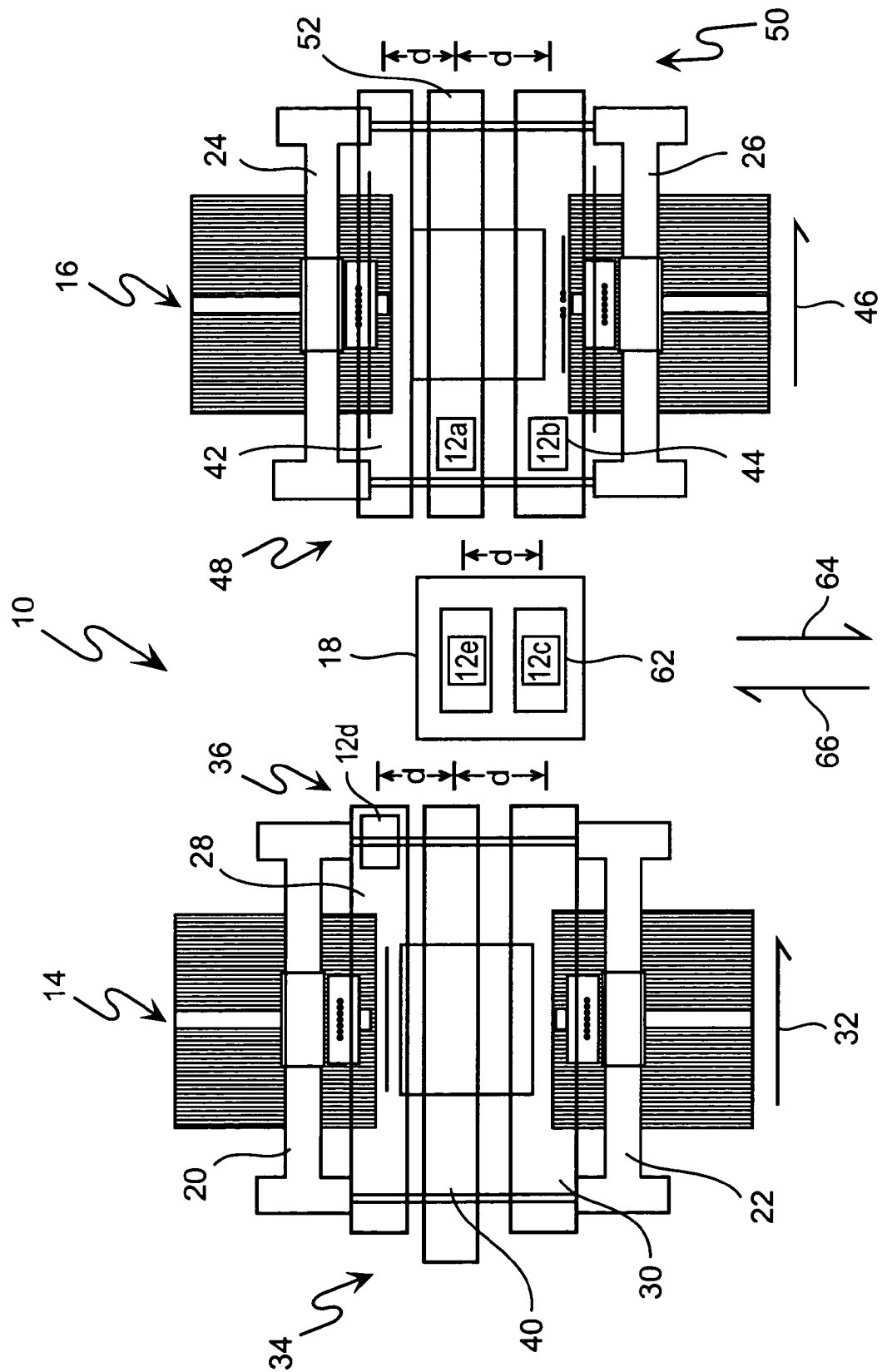
FIG. 1d is a schematic representation of the assembly system of FIG. 1a in a fourth state.

Referring now to FIG. 1d, PCB 12a is off loaded from first station 60 of the shuttle 18 unto second bypass conveyor 52 and PCB 12b is offloaded to second conveyor 44 of second assembly station 26 of second assembly module 16 at the front end 48 thereof. While remaining in the second position, shuttle 18 then loads unpopulated PCB 12e from first bypass conveyor 40 to first transfer portion 60 and populated PCB 12c from second conveyor 30 of the second assembly station 26 of first assembly module 14 to second transfer portion 62, all as shown in FIG. 1d.

Figure 1E:
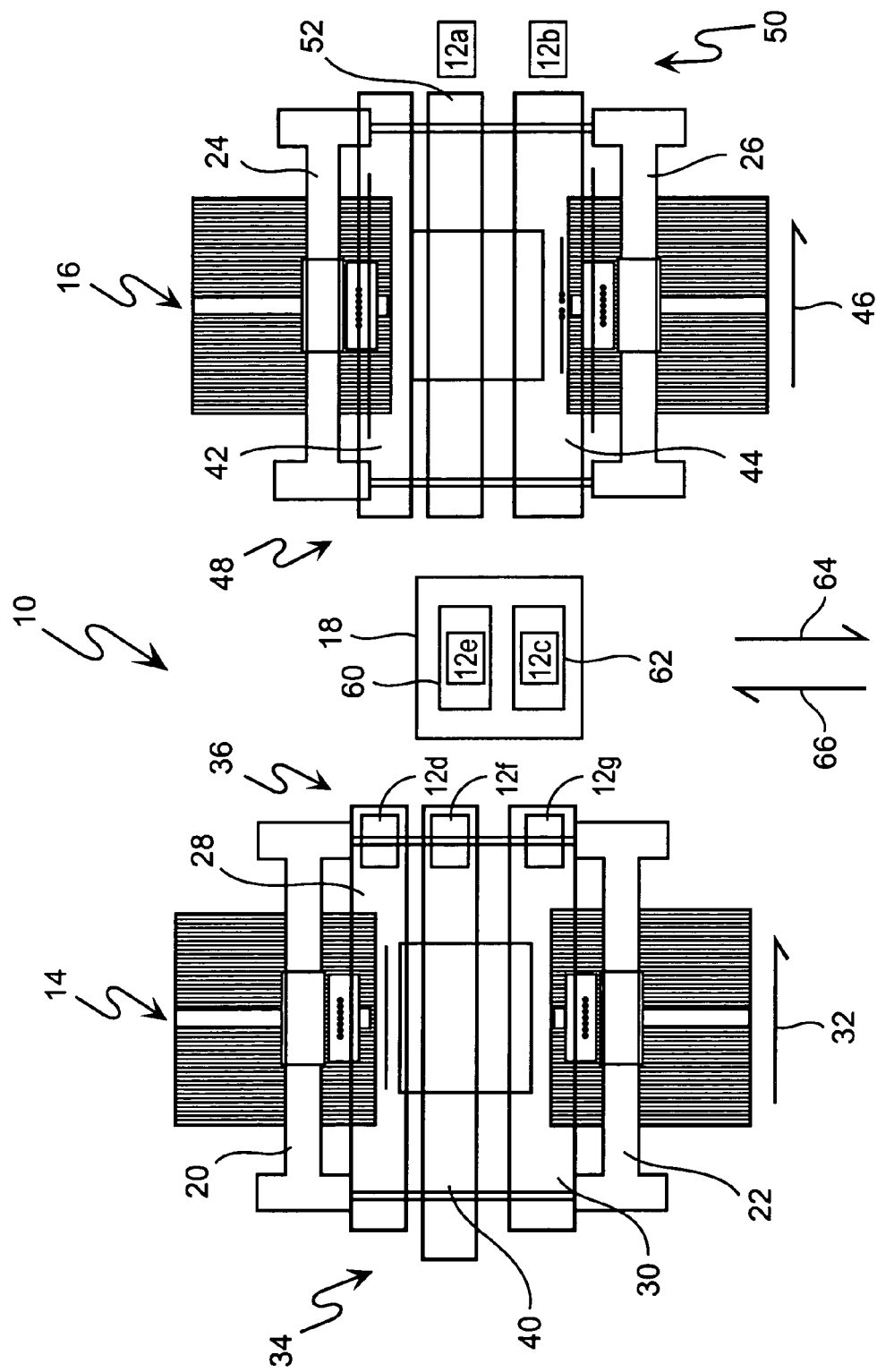
FIG. 1e is a schematic representation of the assembly system of FIG. 1a in a fifth state.

Shuttle 18 then shifts in direction 66 back to its first position, as shown in FIG. 1e. PCB 12a is transported in direction 46 to the back end 50 of the second assembly module 16 by second bypass conveyor 52 and PCB 12b is at least partially populated by the second assembly station 26 of the second assembly module 16 and proceeds to the back end 50 thereof. Unpopulated PCB 12f is loaded unto first bypass conveyor and proceeds to the back end 36 of the first assembly module and PCB 12g is populated by second assembly station 26 and arrives at back end 36 as well.

Figure 1F:
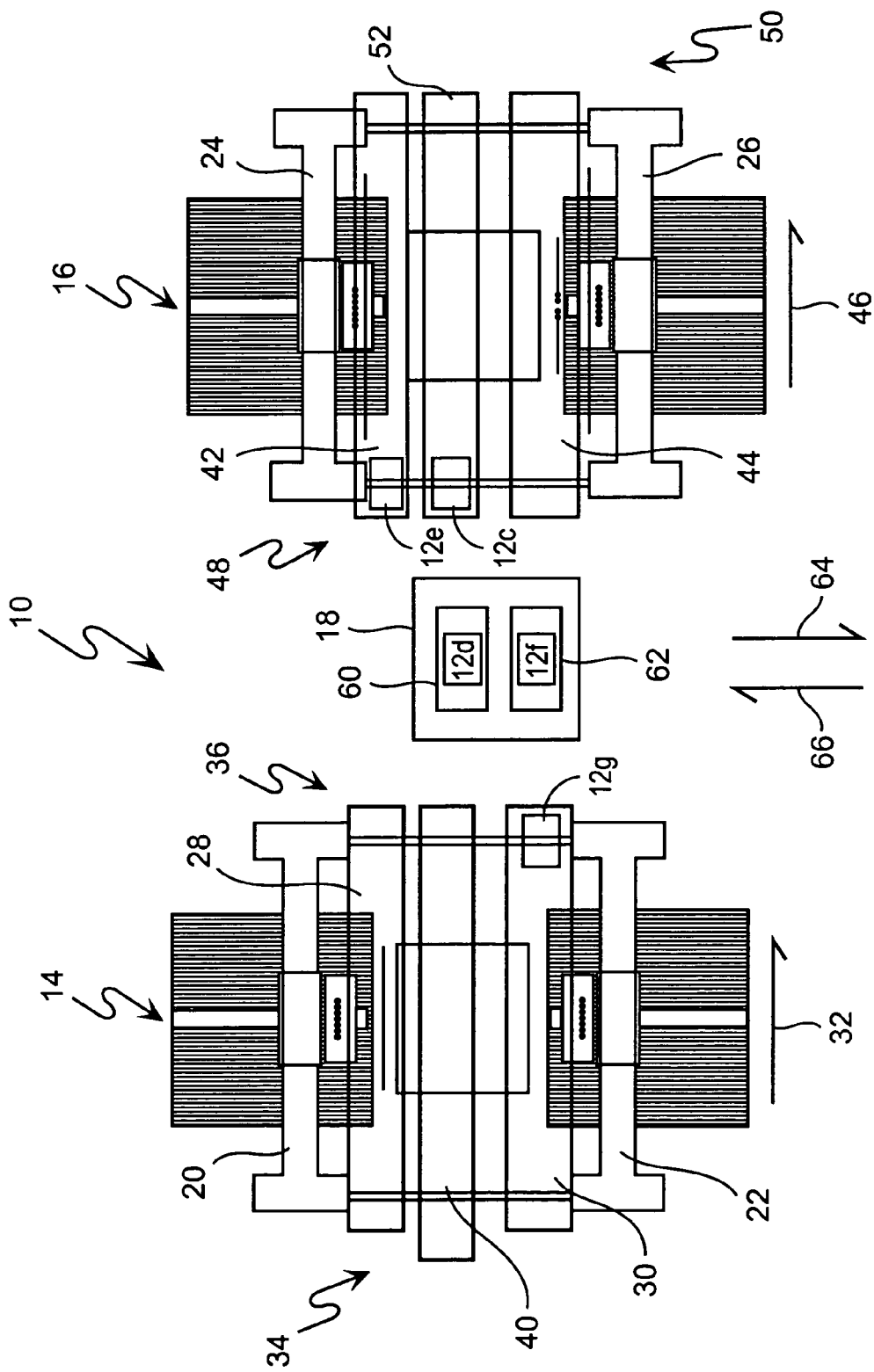
FIG. 1f is a schematic representation of the assembly system of FIG. 1a in a sixth state.

In FIG. 1f, PCBs 12a and 12b have been transported away from second assembly module and exit system 10, possibly for further processing. PCB 12c has been offloaded from second transfer portion 62 of shuttle 18 to second bypass conveyor 52 and PCB 12e has been offloaded to the first conveyor 42 of first assembly station 24 of the second assembly module 16.

PCB 12f is then transferred from first conveyor 28 of the first assembly station 20 to the first transfer portion of shuttle 18 and PCB 12d has been transferred from the first bypass conveyor 40 of first assembly module 14 to the second transfer portion 62 of the shuttle. PCB 12g has been populated by the second assembly station 26 of the first assembly module 14 and is residing at back end 36 of the first assembly module until the shuttle shifts back to its second position for offloading. Thus, the system 10 as arrived at a state depicted in FIG. 1f that is equivalent to that shown in FIG. 1a. Further processing of PCBs proceeds repeatedly as described hereinabove.

The flow pattern of PCBs 12 through the system is depicted schematically in FIG. 2, wherein unpopulated PCBs are conveyed through first assembly module 14 and then alternatively transferred by shuttle 18 to first and second assembly station 24 and 26 of the second assembly module to be populated (see arrows 70, 70a and 70b. PCBs that are populated by either first or second assembly station 20 and 22 of the first assembly module 14 are joined by shuttle 18 when transferred to second bypass conveyer 53 (see arrows 72, 72a and 72b). In this manner, the system 10 of the present invention may efficiently assembly electronic components to a plurality of PCBs, using a minimal amount of floor space.

It will be understood that the system of the present invention may be conveniently constructed with a central programmable controller (not shown), such as a personal computer or the like, to remote and automatically control and monitor the operation of the system and to optimize the flow of PCBs therethrough. Alternatively, each of the assembly stations or assembly module may be separately automatically controlled by a dedicated controller (not shown) that is concerned only with the operation of that portion of the system. In addition, although each of the assembly stations 20, 22, 24 and 26 are depicted as a single Pick and Place unit, it is within the spirit and scope of the present invention to provide a plurality of Pick and Place machines that are connected in series and operate as a combined unit for any one or all of the assembly stations.

For instance, in FIG. 3, there is shown an alternative embodiment of the system 10' in which the first assembly module 14' includes a plurality of Pick and Place machines 20a, 20b, 20c and 20d operatively connected in series to form first assembly station 20 and machines 22a, 22b, 22c, and 22d operatively connected in series to form the first and second assembly stations 14' and 16', respectively, with a common bypass conveyor 40 interposed therebetween. Similarly, second assembly module 16' includes machines 24a and 24b operatively connected in series to form first assembly station 24' and machines 26a, 26b, 26c, 26d, 26e, 26f, 26g, and 26h operatively connected in series to form second assembly station 26'. Of course, any desired combination of machines may be employed as found advantageous in a particular situation.

It will also be understood that the system 10, 10' as described herein typically forms a part of a longer "line" of equipment for processing PCBs and assembling electronic components thereto. For instance, multiple additional systems or assembly modules may be arranged in series before or after the assembly system of the present invention. Such systems or modules may be constructed and operate according to the present invention or not, as is found advantageous. Other types of processing equipment may be employed. For instance, ink jet printers may be used to imprint unique identifiers to each PCB as it passes through the line. Screen printers may be used to apply solder paste to desired locations on each PCB prior to assembling the electronic components to the PCB. Subsequent to placement of the electronic components on the PCB, the PCBs may be passed through a wave or flow solder machine (for through hole components) or a reflow oven (for surface mount components or the like) to secure and electrically connect the components to the PCB. Additional process steps and equipment that may be employed relate to inspecting, testing and cleaning the PCB and electronic components mounted thereon, as are known in the art and thus will not be discussed in greater detail herein. In particular, it may be found advantageous for the three separate series of PCBs emerging from the second assembly module be processed in parallel, such as by providing a reflow oven with three separate paths (not shown) for the PCBs to travel therethrough.

One of the primary advantages of the system of the present invention is when one or more of the first or second assembly stations of the first and second assembly modules are inoperative. This condition may be due to a malfunction of the equipment, periodic maintenance, or replenishment of the supply of electronic components, or any other condition that renders the assembly station unable to assembly components to the PCBs. Under such circumstances, conventional assembly systems are severely disadvantaged, even rendered completely inoperative. At the least, through put and productivity of the system may be drastically and unacceptably degraded.

However, the arrangement of the present invention provides redundancy in the assembly stations that may be conveniently and easily reconfigured to provide the maximum possible throughput and productivity, given that at least one of the assembly stations is unavailable.

Figure 4:
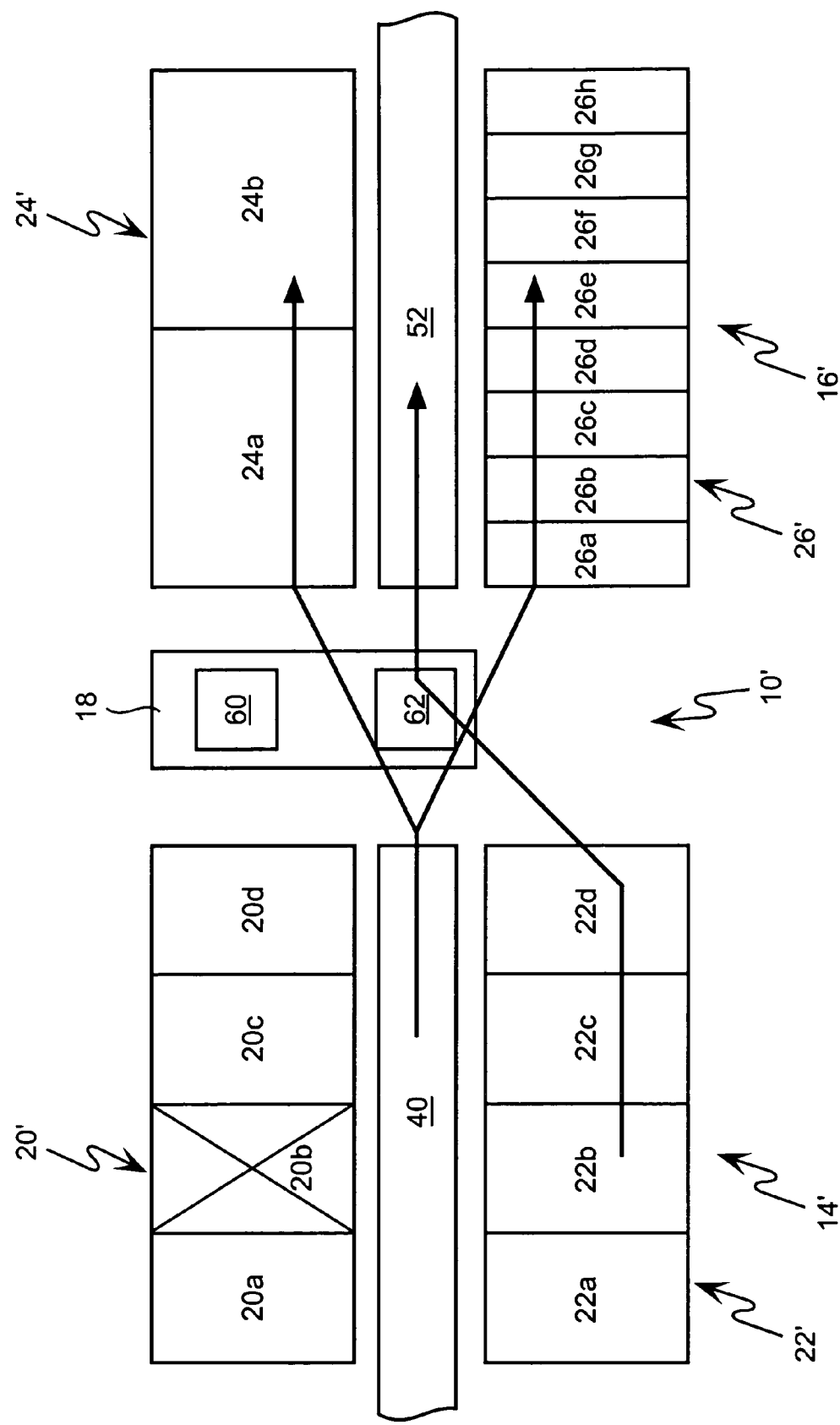
FIG. 4 is a schematic representation of the assembly system of FIG. 3 with one of the assembly station rendered inoperative and showing the path of populated and unpopulated printed circuit boards through the system.

For instance, referring now to FIG. 4, there is shown a schematic representation of the system 10' of FIG. 3 with first assembly station 20' of first assembly module 14' is inoperative. It is possible to program the system such that the first assembly station is bypassed entirely. It is further possible to reconfigure one or more of the second assembly station 22' of the first assembly module 14' and the first and second assembly stations 24' and 26' of the second assembly module 16' to accommodate the absence of the first assembly station 20'. For instance, the supply of the components normally assembled to the PCBs from the first assembly station may be redistributed among one or more of the other remaining operative assembly stations.

It may not be possible to restore all of the productivity of the system 10' including an operative first assembly station 20', but the redundancy of the present invention enables the remaining operative portions of the system to be optimized to the greatest extent possible under the circumstances, and generally to a far greater extent than a conventional assembly system that is arrangement serially.

The present invention has been described in terms of illustrated embodiments thereof. Other embodiments (and combinations of the above embodiments), features and variations within the scope of the appended claims will, given the benefit of this disclosure, occur to those having ordinary skill in the art.

What is claimed is:

1. A method for conveying printed circuit boards (PCBs) in a system having a first assembly module and at least a second assembly module, wherein the first assembly module includes at least a first assembly module internal conveyor and first assembly module bypass conveyor and the second assembly module includes at least a second assembly module internal conveyor and a second assembly module bypass conveyor, the method comprising:
   delivering a first PCB to the first assembly module internal conveyor where the first PCB is processed by the first assembly module;
   delivering a second PCB to the first assembly module bypass conveyor and conveying the second PCB on the first assembly module bypass conveyor so as to bypass the first assembly module;
   delivering the second PCB to the second assembly module internal conveyor where the second PCB is processed by the second assembly module; and
   delivering the first PCB to the second assembly module bypass conveyor and conveying the first PCB on the second assembly module bypass conveyor so as to bypass the second assembly module;
   wherein the second assembly module is arranged in series with the first assembly module.

2. The method of claim 1, wherein the system includes a shuttle arranged between the first assembly module and the second assembly module, and further including tile steps of using the shuttle to transfer the first PCB from the first assembly module internal conveyor to the second assembly module bypass conveyor, and using the shuttle to transfer the second PCB from the first assembly module bypass conveyor to the second assembly module internal conveyor.

3. The method of claim 1, wherein the second assembly module is redundant with the first assembly module.

4. The method of claim 1, wherein the processing includes conveying and populating the PCB with components.

5. A method for conveying printed circuit boards (PCBs) in a system having a first assembly module and at least a second assembly module, wherein the first assembly module includes at least a first assembly module internal conveyor and first assembly module bypass conveyor and the second assembly module includes at least a second assembly module internal conveyor and a second assembly module bypass conveyor, the method comprising:
   delivering a first PCB to the first assembly module internal conveyor where the first PCB is processed by the first assembly module;
   delivering a second PCB to the first assembly module bypass conveyor and conveying the second PCB on the first assembly module bypass conveyor so as to bypass the first assembly module;
   delivering the second PCB to the second assembly module internal conveyor where the second PCB is processed by the second assembly module; and
   delivering the first PCB to the second assembly module bypass conveyor and conveying the first PCB on the second assembly module bypass conveyor so as to bypass the second assembly module;
   wherein the second assembly module is arranged in series with the first assembly module; and
   programming the system so as to bypass an assembly station in one of the assembly modules in the event that the assembly station is inoperative.

6. A method for conveying printed circuit boards (PCBs) in a system having a first assembly module and at least a second assembly module, wherein the first assembly module includes a first assembly module first conveyor and a first assembly module second conveyor, and the second assembly module includes a second assembly module first conveyor and a second assembly module second conveyor, the method comprising:
   processing a first PCB while the first PCB is on the first assembly module first conveyor;
   conveying a second PCB on the first assembly module second conveyor without processing the second PCB;
   transferring the first PCB to the second assembly module second conveyor;
   transferring the second PCB to the second assembly module first conveyor;
   conveying the first PCB on the second assembly module second conveyor without processing the first PCB; and
   processing the second PCB while the second PCB is on the second assembly module first conveyor; and
   wherein the second assembly module is arranged in series with the first assembly module.

7. The method of claim 6, wherein the processing includes conveying and populating the PCB with components.

8. The method of claim 6, wherein the system further includes a shuttle arranged between the first assembly module and the second assembly module, and further including the steps of using the shuttle to transfer the first PCB from the first assembly module first conveyor to the second assembly module second conveyor, and using the shuttle to transfer the second PCB from the first assembly module second conveyor to the second assembly module first conveyor.

9. The method of claim 6, wherein the first assembly module first conveyor is spaced a predetermined distance from the first assembly module second conveyor, and the second assembly module first conveyor is spaced the predetermined distance from the second assembly module second conveyor, and the system further includes a shuttle arranged between the first assembly module and the second assembly module, wherein the shuttle includes two stations, the two shuttle stations being spaced the predetermined distance from each other, and further including the steps of using one of the stations of the shuttle to transfer the first PCB from the first assembly module first conveyor to the second assembly module second conveyor, and using another of the stations of the shuttle to transfer the second PCB from the first assembly module second conveyor to the second assembly module first conveyor.

10. The method of claim 6, wherein the second assembly module is redundant with the first assembly module.

11. A method for conveying printed circuit boards (PCBs) in a system having a first assembly module and at least a second assembly module, wherein the first assembly module includes a first assembly module first conveyor and a first assembly module second conveyor, and the second assembly module includes a second assembly module first conveyor and a second assembly module second conveyor, the method comprising:

processing a first PCB while the first PCB is on the first assembly module first conveyor;
conveying a second PCB on the first assembly module second conveyor without processing the second PCB;
transferring the first PCB to the second assembly module second conveyor;
transferring the second PCB to the second assembly module first conveyor;
conveying the first PCB on the second assembly module second conveyor without processing the first PCB; and
processing the second PCB while the second PCB is on the second assembly module first conveyor; and
wherein the second assembly module is arranged in series with the first assembly module; and
programming the system so as to bypass an assembly station in one of the assembly modules in the event that the assembly station is inoperative.

12. A method for conveying printed circuit boards (PCBs) in a system having a first assembly module and at least a second assembly module arranged in series with the first assembly module, wherein the first assembly module includes a first assembly module first internal conveyor, a first assembly module second internal conveyor, and a first assembly module bypass conveyor and the second assembly module includes a second assembly module first internal conveyor, a second assembly module second internal conveyor, and a second assembly module bypass conveyor, wherein the second assembly module is redundant with the first assembly module, the method comprising:

determining that a portion of one of the assembly modules is inoperative;
bypassing the internal conveyor associated with the inoperative portion of the assembly module; and
populating the PCBs with remaining operative portions of the first and second assembly modules.

* * * * *

UNITED STATES PATENT AND TRADEMARK OFFICE
CERTIFICATE OF CORRECTION

| | |
|---|---|
| PATENT NO. | : 7,032,304 B2 |
| APPLICATION NO. | : 10/683001 |
| DATED | : April 25, 2006 |
| INVENTOR(S) | : Gieskes |

It is certified that error appears in the above-identified patent and that said Letters Patent is hereby corrected as shown below:

<u>Column 4</u>
Line 51, delete "are then are" and insert -- are then --

<u>Column 7</u>
Line 14, delete "firs" and insert -- first --

<u>Column 10</u>
Line 9, delete "tile" and insert -- the --

Signed and Sealed this

Twenty-second Day of August, 2006

JON W. DUDAS
*Director of the United States Patent and Trademark Office*